United States Patent [19]

Kaneyama et al.

[11] Patent Number: 5,258,617
[45] Date of Patent: Nov. 2, 1993

[54] METHOD AND APPARATUS FOR CORRECTING AXIAL COMA IN ELECTRON MICROSCOPY

[75] Inventors: Toshikatsu Kaneyama; Toshikazu Honda, both of Tokyo, Japan

[73] Assignee: Jeol Ltd., Tokyo, Japan

[21] Appl. No.: 898,440

[22] Filed: Jun. 15, 1992

[30] Foreign Application Priority Data

Jun. 21, 1991 [JP] Japan .................. 3-150487

[51] Int. Cl.⁵ .............................. H01J 37/26
[52] U.S. Cl. ........................ 250/311; 250/397
[58] Field of Search ............... 250/311, 310, 397, 398

[56] References Cited

U.S. PATENT DOCUMENTS 4,788,425 11/1988 Kobayashi ..................... 250/311

OTHER PUBLICATIONS

*Ultramicroscopy 3* (1978), pp. 49-60, F. Zemlin et al.

Primary Examiner—Paul M. Dzierzynski
Assistant Examiner—Kiet T. Nguyen
Attorney, Agent, or Firm—Webb, Burden, Ziesenheim & Webb

[57] ABSTRACT

Method and apparatus for correcting the axial coma in the image created by an electron microscope without requiring skillfulness or any other peripheral device. The microscope is equipped with a beam wobbler and brings the voltage center or current center into the middle of the final image by controlling the deflection coils. The amount of the deviation of the voltage center or current center from the coma-free axis is previously found and stored in an area of a memory. This beam is tilted by the amount of the deviation read from the memory. For this purpose, a deflecting signal corresponding to the amount of the deviation is produced to the deflection coils. Therefore, once the deviation is found, the axial coma can be corrected simply and routinely by correcting the beam tilt by the amount of deviation after the voltage center or current center is brought into the middle of the final image.

6 Claims, 4 Drawing Sheets

DETECTION OF DEVIATION FROM COMA-FREE AXIS

ROUTINE OPERATIONS

METHOD AND APPARATUS FOR CORRECTING AXIAL COMA IN ELECTRON MICROSCOPY

FIELD OF THE INVENTION

The present invention relates to method and apparatus for correcting the axial coma produced in the image created by an electron microscope designed to permit one to easily bring the voltage center or current center of the microscope into the middle of the viewing screen.

BACKGROUND OF THE INVENTION

When the alignment of an electron microscope is performed, either the voltage center or the current center is brought into the middle of the viewing screen. Generally, when the accelerating voltage is changed, the image wobbles about a point. Accordingly, if the accelerating voltage varies, the effect of this variation on the final image is minimized by adjusting the incident direction of the electron beam impinging on the specimen in such a way that this point is brought into the middle of the final image. This alignment is herein referred to as a voltage center alignment. When the excitation current supplied to the objective lens is varied, the image wobbles about a point. The incident direction of the electron beam falling on the specimen is adjusted so that this point is located at the center of the final image. This is herein referred to as a current center alignment. Once the current center alignment is complete, if the objective-lens current is varied slightly, the center of the image does not move.

A beam wobbler is incorporated in an electron microscope to facilitate these alignment operations. This wobbler modulates the accelerating voltage or the objective-lens current with a sinusoidal wave, triangular wave, saw-toothed wave, or other wave. When the wobbler is in operation, the still, or motionless, center of the image can be clearly discerned. That is, the position of the voltage center or the current center can be known clearly. This center is brought into the center of the final image. In this way, the voltage center alignment or current center alignment is performed.

However, the coaxial coma that is one kind of aberration remains even if the above-described alignments are made. Hence, it is impossible to sufficiently increase the resolution of the electron microscope. Specifically, if such axial coma is large, the quality of the final image differs from location to location. For example, if the aberrations are corrected so as to eliminate the astigmatism in the center of the image, the image quality at the edge of the micrograph is lower, which is an impediment to correct interpretation of the image.

In analytical electron microscopes developed recently, the magnetic field produced in front of the objective lens is made strong. Therefore, the presence of the axial coma presents more serious problems. An alignment method of removing the axial coma is described by F. Zemlin et al. in *Ultramicroscopy* 3 (1978), pp. 49-60. In this method, the direction a in which no axial coma exists is found in the manner described below. The electron beam that is caused to enter a specimen S is tilted about this direction a by the same angle in positive and negative directions b+ and b− as shown in FIG. 1. Similarly, the beam is made to hit the specimen while the beam is tilted in directions c+ and c−. The microscopist adjusts the tilt of the beam until the two images look exactly the same. In this way, the direction a is found.

In order to find the direction in which no axial coma is present, skillful electron micrograph observation techniques are required. Also, the use of an image processing apparatus is recommended in addition to the body of the microscope. Furthermore, an amorphous thin film is needed as a specimen. Consequently, it cannot be said that these operations can be performed routinely. Therefore, the present situation is that no countermeasure has been taken against the reduction in the resolution due to the axial coma.

SUMMARY OF THE INVENTION

It is an object of the present invention to provide a method of correcting the axial coma produced in the image created by an electron microscope without the necessity of operator's skillfulness or any peripheral device.

In this method, a deflecting signal corresponding to the amount of the deviation of the voltage center or the current center from the coma-free axis is previously found, and data about this deflecting signal is stored in a memory. The electron beam tilt is adjusted until the voltage center or current center is brought into the middle of the final image, using a deflector which varies the incident angle of the electron beam impinging on a specimen. The data about the deflecting signal is read from the memory, and the electron beam is tilted by the aforementioned amount of deviation.

The voltage center alignment or current center alignment can be effected quite easily by the use of, for example, a beam wobbler. After the voltage center alignment or current center alignment has been performed by a simple operation, the electron beam is tilted from this position by the above-described amount of deviation. In this way, the beam can be quickly brought onto the coma-free axis. Consequently, once the amount of the deviation of the voltage center or current center from the coma-free axis is found, the axial coma can be routinely corrected by correcting the voltage or current center alignment and then adjusting the beam tilt by the amount of the deviation described above.

Other objects and features of the invention will appear in the course of the description thereof which follows.

DETAILED DESCRIPTION OF THE INVENTION

Figure 2:
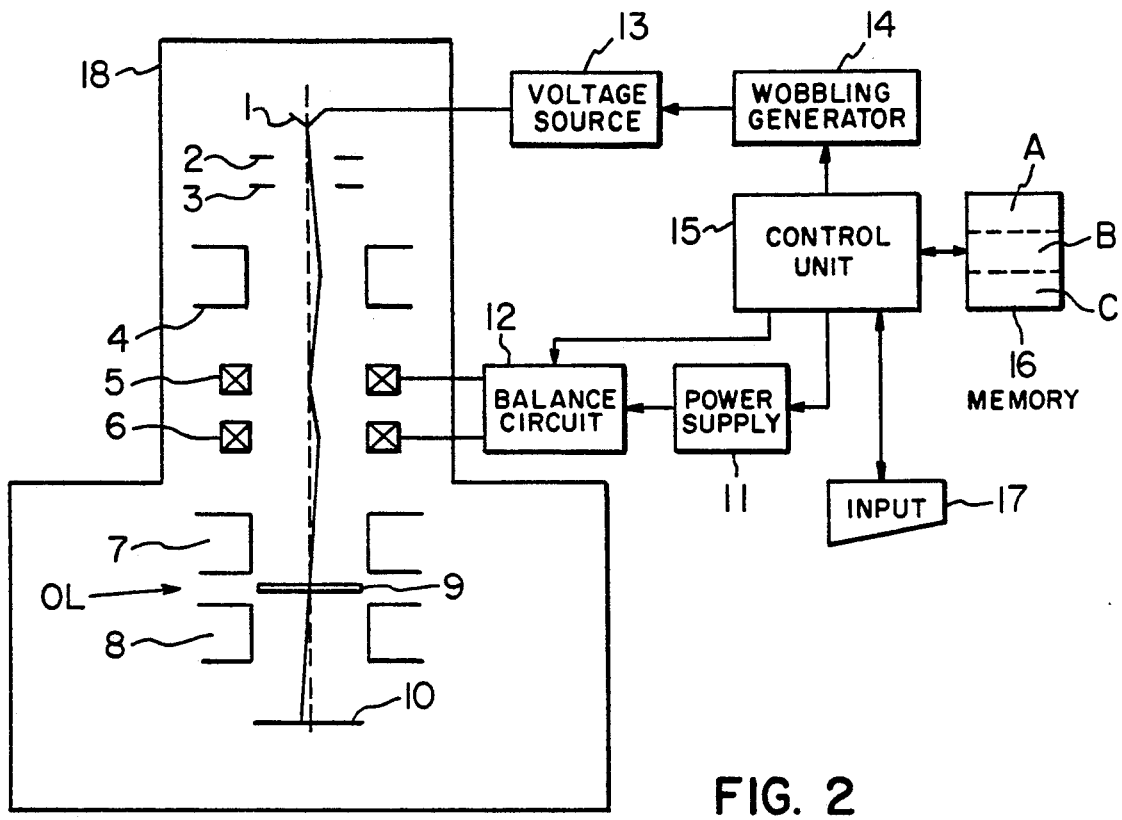
FIG. 2 is a schematic diagram of an apparatus for carrying out a method according to the invention.

Referring to FIG. 2, there is shown an electron microscope adapted to correct the axial coma produced in the image. This microscope comprises an electron gun 1, accelerating electrodes 2, 3, a condenser lens 4, deflection coils 5, 6, and objective lens OL consisting of an upper pole piece 7 and a lower pole piece 8, a fluorescent screen 10, an accelerating voltage source 13, a deflection power supply 11, a balance circuit 12, a wobbling signal generator circuit 14, a control unit 15, a memory 16, an input device 17, and a microscope column 18. A specimen 9 is placed between the upper pole piece 7 of the objective lens OL and the lower pole piece 8.

The electron gun 1 emitting an electron beam is disposed at the top of the microscope column 18 of the electron microscope. To accelerate the emitted electrons, the accelerating electrodes 2 and 3 are mounted. The condenser lens 4, the deflection coils 5 and 6 are positioned below the accelerating electrodes 2, 3. The pole pieces 7 and 8 of the objective lens OL are disposed below the deflection coils 5 and 6. The upper deflection coils 5 comprise an x-axis coil and a y-axis coil. Similarly, the lower deflection coils 6 comprise an x-axis coil and a y-axis coil. The deflection power supply 11 produces a deflecting signal which is supplied to the upper deflection coils 5 and to the lower deflection coils 6 via the balance circuit 12. This balance circuit 12 divides the deflecting signal from the deflection power supply 11 at a preset ratio and distributes the resulting signals to the deflection coils 5 and 6. The ratio is determined according to the instruction given from the control unit 15 such that the tilt angle of the electron beam incident on the specimen 9 can be adjusted while the position at which the beam hits the specimen 9 is fixed. The beam is strongly converged by the magnetic field produced before the objective lens located ahead of the specimen 9, and is focused onto the specimen 9 placed between the pole pieces 7 and 8. The objective lens OL acts as a so-called condenser objective lens.

Figure 3A:
FIGS. 3(a) and 3(b) are diagrams showing the waveforms of wobbling signals produced in accordance with the present invention.
Figure 3B:
Figure 1:
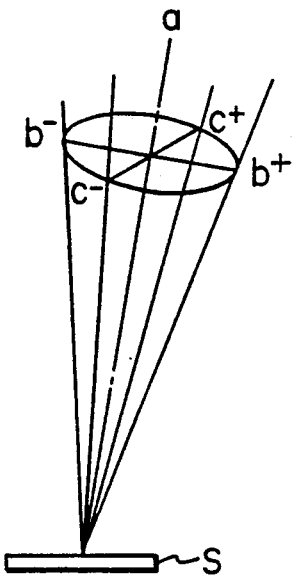
FIG. 1 is a diagram illustrating the prior art method of correcting axial coma.

The accelerating voltage source 13 serves to produce the accelerating voltage applied to the electron gun 1. This voltage source 13 receives the wobbling signal from the wobbling signal generator circuit 14. This circuit 14 produces a triangular wave (FIG. 3($a$)), a sinusoidal wave (FIG. 3($b$)), or other periodic modulating signal such as a rectangular wave. The accelerating voltage produced by the voltage source 13 is modulated with the wobbling signal delivered from the circuit 14. The control unit 15 is provided to control the generation of the wobbling signal and the deflecting signal produced from the deflection power supply 11. The memory 16 and the input device 17 are connected to the control unit 15. An area C is secured in the memory 16 to store data about the amount of deflection corresponding to the amount of the deviation of the voltage center from the coma-free axis.

Figure 4A:
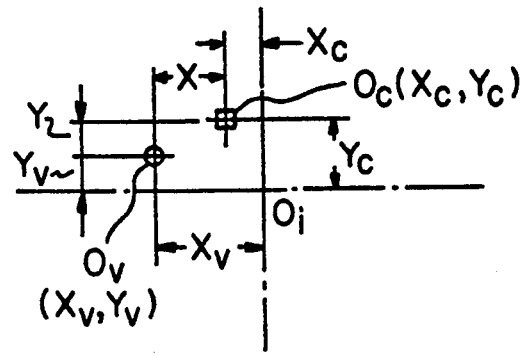
FIGS. 4(a), 4(b) and 4(c) are diagrams illustrating the relation of the voltage center or current center to the coma-free axis and alignment operations.
Figure 4B:
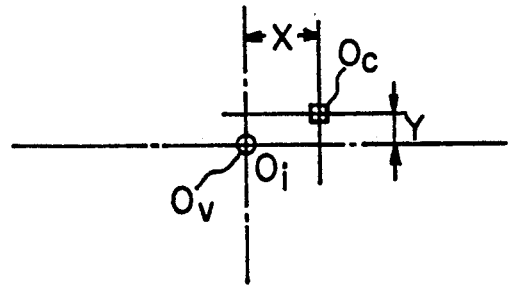
Figure 4C:
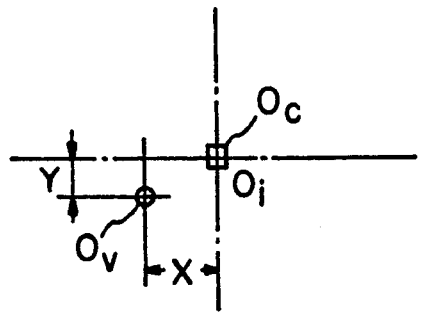
Figure 5A:
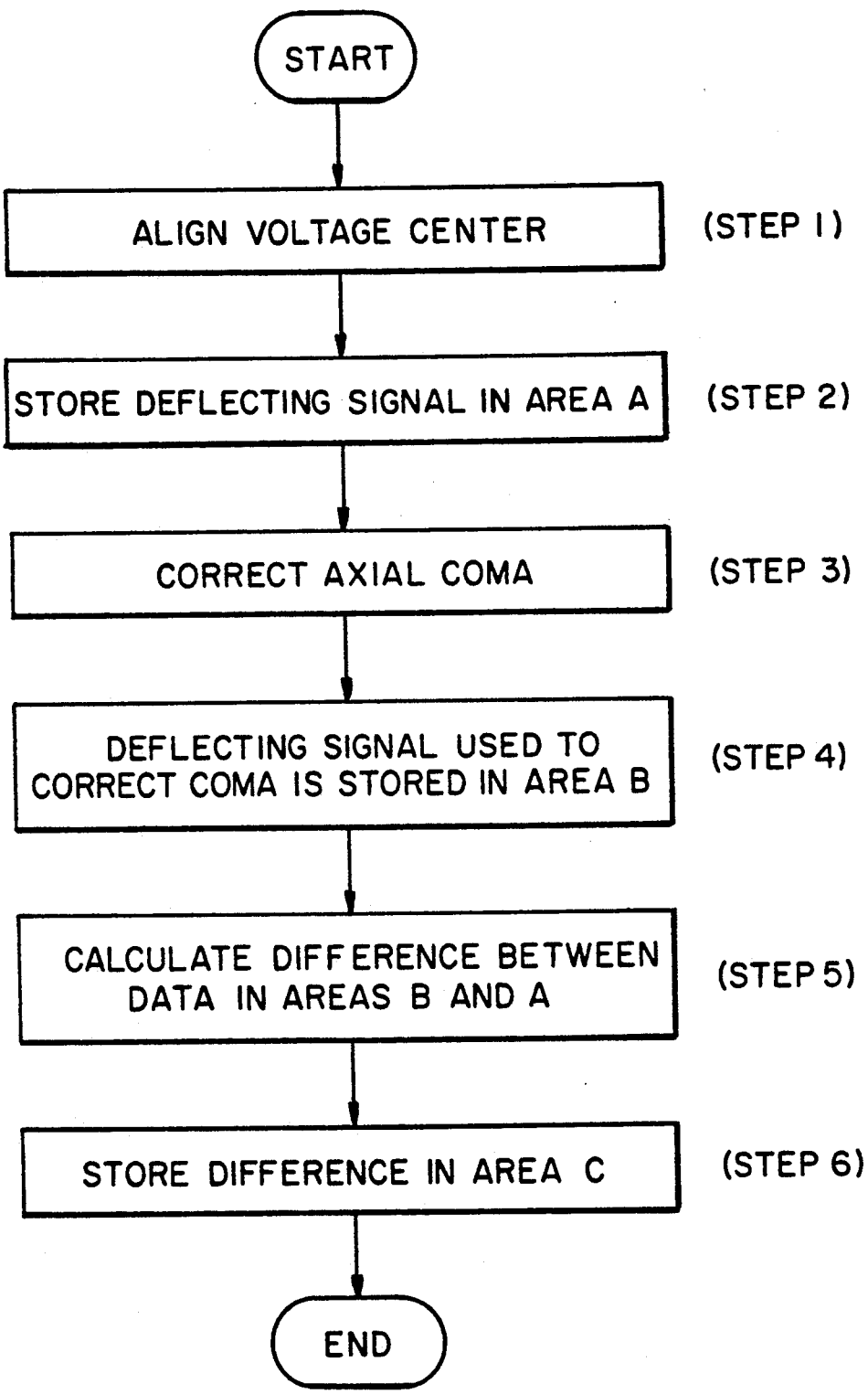
FIGS. 5(a) and 5(b) are flowcharts illustrating operations successively performed by a human operator to carry out the novel method.
Figure 5B:
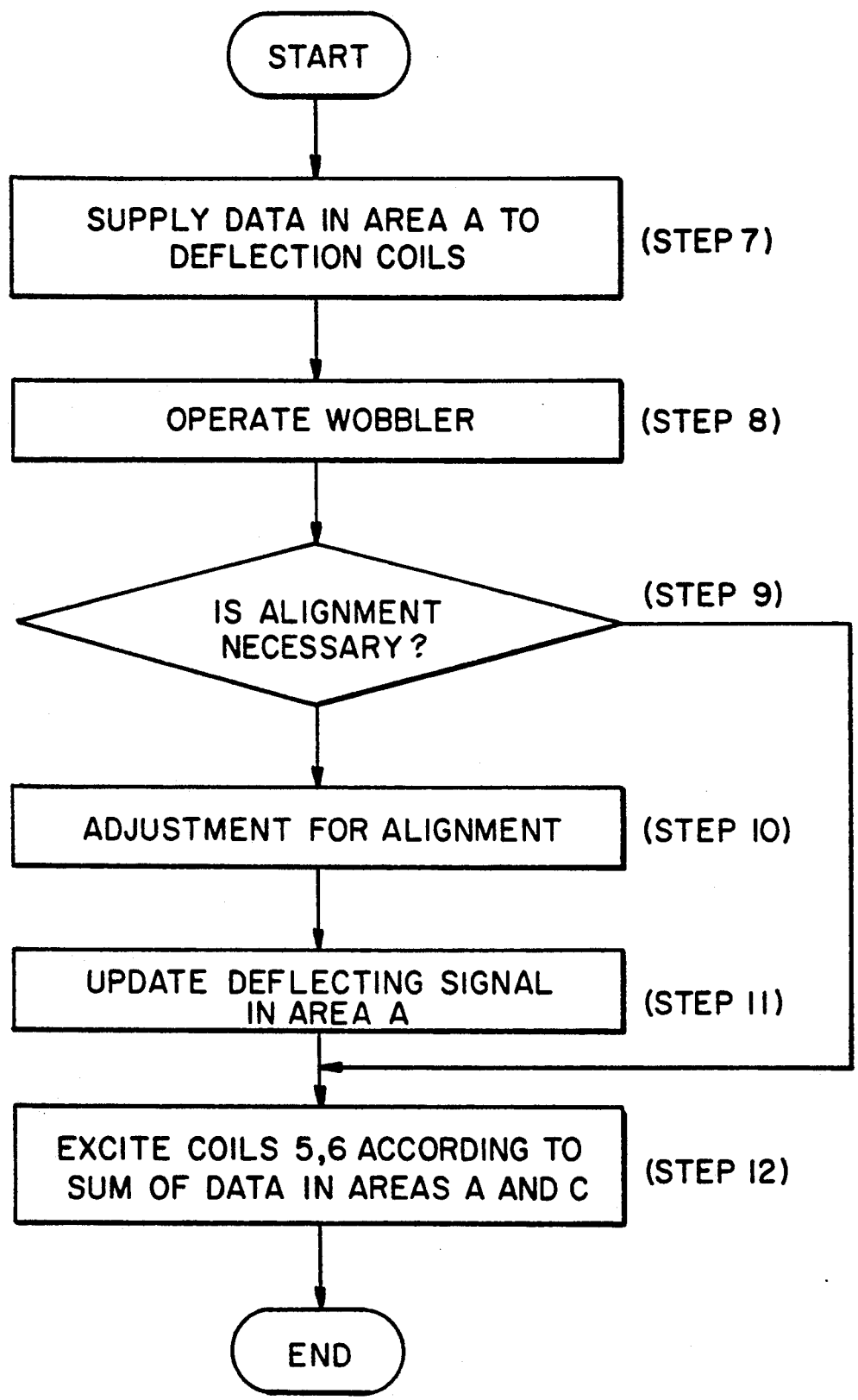

An example of operation performed to correct the axial coma in accordance with the present invention is next described by referring to FIG. 4($a$)-FIG. 4($c$) and FIG. 5($a$) and FIG. 5($b$). Referring to FIG. 4($a$), let the center $O_i$ of the final image be located at the origin of the coordinate system. The coma-free axis $O_c$ is given by ($x_c$, $y_c$). The voltage center $O_v$ is given by ($x_v$, $y_v$). When the instrument is not yet adjusted, the center $O_i$ of the final image agrees neither with the coma-free axis $O_c$ nor with the voltage center $O_v$. The x-component X and the y-component Y of the deviation of the voltage center $O_v$ from the coma-free axis $O_c$ are given by $x_c-x_v$ and $y_c-y_v$, respectively. These components X and Y are intrinsic to the instrument. Therefore, when the voltage center $O_v$ is brought into the center $O_i$ of the final image as shown in FIG. 4($b$) by controlling the deflection coils 5 and 6, the coma-free axis $O_c$ shifts accordingly. As shown in FIG. 4($c$), when the coma-free axis $O_c$ is brought into the center $O_i$ of the final image, the voltage center $O_v$ shifts similarly.

As described previously, very much labor and skillfulness are needed to find the coma-free axis $O_c$. On the other hand, the voltage center $O_v$ can be easily brought into the middle of the final image by adjusting the accelerating voltage. One example of the invention is now described by referring to the flowchart of FIG. 5($a$). The deviation of the voltage center $O_v$ from the coma-free axis $O_c$ is previously found. When a specimen image is observed on a routine basis, the axial coma can be corrected only after adjusting the voltage center $O_v$ as illustrated in FIG. 5($b$).

As illustrated in FIG. 5($a$), the final image created on the fluorescent screen 10 rotates in two directions alternately while changing the diameter of the image when the accelerating voltage is wobbled. A point that is fixed in spite of the wobbling the accelerating voltage can be found. The input device 17 is operated by the human operator to adjust the deflecting current produced from the deflection power supply 11. Thus, the fixed point is brought into the middle of the final image. As a result, a voltage center alignment is completed (step 1). Data about a signal $S_v$ indicating the output current from the deflection power supply 11 under this aligned condition is stored in an area A of the memory 16 (step 2). Then, the axial coma is corrected (step 3). All of these steps can be carried out, making direct use of the prior art techniques as described previously. Data about a signal $S_c$ indicating the output current from the deflection power supply 11 at this time is stored in an area B of the memory 16 (step 4). Thereafter, the control unit 15 reads data about the signals $S_c$ and $S_v$ and calculates the difference ($S_c-S_v$) between them, i.e., computes the difference between the values stored in the areas B and A, respectively (step 5). Data about the calculated difference is stored in the area C of the memory 16 (step 6). As described above, the amount of the deviation of the voltage center from the coma-free axis, is intrinsic to the microscope and, therefore, it does not change unless the mechanical relations among the lenses and the coils are altered. Hence, this procedure is needed only once.

By the above-described processing, data about the excitation current in the deflection coils needed to bring the voltage center $O_v$ into the middle $O_i$ of the final image as shown in FIG. 4($b$) is stored in the area A of the memory 16. Also, data about the deflecting signal ($S_c-S_v$) corresponding to the amount of the deviation of the voltage center $O_v$ from the coma-free axis $O_c$ is stored in the area C of the memory 16. That is, data about the deflecting signal required to shift the apparatus from the voltage center-aligned condition to the coma-free condition is stored in the area C of the memory 16.

The coma-free condition can be easily realized by the procedure illustrated in FIG. 5($b$) in routinely operating the electron microscope for observing the specimen image. First, data stored in the area A of the memory 16 is read out. According to the data, a deflecting current is supplied from the deflection power supply 11 to the deflection coils 5 and 6 (step 7). Then, the wobbling signal generator circuit 14 produces a wobbling signal to the accelerating voltage source 13 to vary the accelerating voltage (step 8). During this wobbling step, the operator watches the image and sees whether the voltage center $O_v$ lies in the center $O_i$ of the final image. That is, he or she determines whether a voltage center alignment is needed (step 9). If the voltage center $O_v$ is situated in the center $O_i$ of the final image, dispensing with voltage center alignment, then control proceeds to step 12. The control unit 15 instructs the deflection power supply 11 to produce a deflecting signal according to the sum of the value stored in the area A and the value stored in the area C. The deflection coils 5 and 6 are excited in response to this deflecting signal, thus correcting the axial coma. If a voltage center alignment is necessary, control goes to step 10, where the beam tilt is adjusted to bring the voltage center into the middle of the final image. If the aforementioned signal $S_v$ is modified by this adjustment, then the data stored in the area A of the memory is changed to the data produced after the adjustment (step 11). To observe the image without the axial coma, control goes to step 12 described above. That is, the value stored in the area A of the memory and the value stored in the area C are summed up. The control unit 15 causes the deflection power supply 11 to produce the deflecting signal in response to the sum, for correcting the axial coma. Therefore, it is not necessary to know where the coma-free axis $O_c$ is located. The condition shown in FIG. 4(c) can be readily achieved, and the axial coma is corrected.

It is to be understood that the present invention is not limited to the above embodiment and that various changes and modifications are possible. In the above embodiment, the wobbler is operated to bring the voltage center into the middle of the final image. Then, the amount of deflection is corrected according to a deflecting signal corresponding to the amount of the deviation of the voltage center from the coma-free axis. The amount of the deviation may also be automatically corrected in step with the operation of the wobbler. The data about the deflecting signal needed for the voltage center alignment and the data used for correcting the deviation of the voltage center from the coma-free axis are stored in the memory. Only the data used for correcting the deviation may be stored in the memory. In this case, whenever an image observation is started, the voltage center alignment should be carried out manually. Then, the axial coma may be corrected, using data for correcting the deviation.

Also in the above embodiment, the coma-free alignment is effected using the same deflector which is used for the voltage center alignment. However, a second deflector used only for correction of the axial coma may be provided. The deflecting signal corresponding to the amount of the deviation of the voltage center from the coma-free axis is supplied to the second deflector when the coma-free alignment is effected after the voltage center alignment. Furthermore, in the above embodiment, a voltage center alignment is employed to correct the axial coma. Instead, a current center alignment can be effected.

As described thus far, in accordance with the present invention, the deviation of the voltage center or current center from the coma-free axis is found previously. Then, the voltage center or current center is aligned with the coma-free axis, for correcting the axial coma. This correction of the axial coma is needed to make the whole image have high and reliable image quality. The correction of the coma can be easily and quickly performed without requiring skillfulness or any other peripheral device.

Having thus described our invention with the detail and particularity required by the Patent Laws, what is claimed to be protected by Letters Patent is set forth in the following claims.

What is claimed is:

1. A method of operating an electron microscope to correct the axial coma produced in the image of an electron beam directed at a specimen, said electron microscope having a deflector for adjusting the incident angle of the beam on the specimen comprising the steps of:
    finding a deflecting signal required by the deflector for adjusting the angle of the electron beam which corresponds to the amount of the deviation of the voltage center from the coma-free axis and storing the value of the deflecting signal in a memory;
    bringing the voltage center into the middle of the image, using said deflector; and
    deflecting the electron beam by the amount of the deviation according to the deflecting signal read from the memory.

2. An apparatus for correcting the axial coma produced in the image of an electron beam directed at a specimen created by an electron microscope, said apparatus comprising:
    a wobbling means for varying the accelerating voltage for the electron beam;
    an electron beam deflector for varying the incident angle of the electron beam impinging on said specimen;
    a variable deflecting signal-generating means for producing a deflecting signal supplied to the electron beam deflector;
    a coma-correcting signal-generating means for producing a deflecting signal corresponding to the amount of the deviation of the voltage center from the coma-free axis; and
    a means which produces the sum signal of the deflecting signal from the variable deflecting signal-generating means and the deflecting signal from the coma-correcting signal-generating means and supplies the resulting sum signal to the electron beam deflector.

3. An apparatus for correcting the axial coma produced in the image of an electron beam directed at a specimen created by an electron microscope, said apparatus comprising:
    a wobbling means for varying the accelerating voltage of the beam;
    a first electron beam deflector for varying the incident angle of the electron beam impinging on said specimen;
    a variable deflecting signal-generating means for producing a deflecting signal supplied to the first electron beam deflector;
    a coma-correcting signal-generating means for producing a deflecting signal corresponding to the amount of the deviation of the voltage center from the coma-free axis; and
    a second electron beam deflector which deflects the electron beam according to the signal from the coma-correcting signal-generating means to correct the axial coma.

4. A method of operating an electron microscope to correct the axial coma produced in the image of an electron beam directed at a specimen, said electron microscope having a deflector for adjusting the incident angle of the beam on the specimen, comprising the steps of:
- finding a deflecting signal required by the deflector for adjusting the angle of the electron beam which corresponds to the amount of the deviation of the current center from the coma-free axis and storing the value of the deflecting signal in a memory;
- bringing the current center into the middle of the image, using said deflector which varies the incident angle of the electron beam impinging on a specimen; and
- deflecting the electron beam by the amount of the deviation according to the deflecting signal read from the memory.

5. An apparatus for correcting the axial coma produced in the image created by an electron microscope of an electron beam directed at a specimen, said apparatus comprising:
- an objective lens and a wobbling means for varying the objective-lens current;
- an electron beam deflector for varying the incident angle of the electron beam impinging on said specimen;
- a variable deflecting signal-generating means for producing a deflecting signal supplied to the electron beam deflector;
- a coma-correcting signal-generating means for producing a deflecting signal corresponding to the amount of the deviation of the current center from the coma-free axis; and
- a means which produces the sum of the deflecting signal from the variable deflecting signal-generating means and the deflecting signal from the coma-correcting signal-generating means and supplies the resulting sum signal to the electron beam deflector.

6. An apparatus for correcting the axial coma produced in the image created by an electron microscope of an electron beam directed at a specimen, said apparatus comprising:
- an objective lens and a wobbling means for varying the objective-lens current;
- a first electron beam deflector for varying the incident angle of the electron beam impinging on said specimen;
- a variable deflecting signal-generating means for producing a deflecting signal supplied to the first electron beam deflector;
- a coma-correcting signal-generating means for producing a deflecting signal corresponding to the amount of the deviation of the current center from the coma-free axis; and
- a second electron beam deflector which deflects the electron beam according to the signal from the coma-correcting signal-generating means to correct the axial coma.

* * * * *